United States Patent
Luoh et al.

(10) Patent No.: US 7,625,819 B2
(45) Date of Patent: Dec. 1, 2009

(54) INTERCONNECTION PROCESS

(75) Inventors: Tuung Luoh, Taipei (TW); Ling-Wu Yang, Hsinchu (TW); Chin-Ta Su, Yunlin (TW); Ta-Hung Yang, Miaoli (TW); Kuang-Chao Chen, Taipei (TW)

(73) Assignee: Macronix International Co., Ltd., Hsinchu (TW)

( * ) Notice: Subject to any disclaimer, the term of this patent is extended or adjusted under 35 U.S.C. 154(b) by 49 days.

(21) Appl. No.: 11/806,541

(22) Filed: Jun. 1, 2007

(65) Prior Publication Data

US 2008/0299761 A1    Dec. 4, 2008

(51) Int. Cl.
*H01L 21/44* (2006.01)
*H01L 21/4763* (2006.01)

(52) U.S. Cl. .............. 438/630; 438/629; 438/597; 257/E21.585

(58) Field of Classification Search .......... 438/597, 438/618, 627, 629, 630, 631; 257/E21.585
See application file for complete search history.

(56) References Cited

U.S. PATENT DOCUMENTS

| | | | |
|---|---|---|---|
| 6,169,019 B1* | 1/2001 | Takagi | 438/597 |
| 2004/0207045 A1* | 10/2004 | Imoto | 257/536 |
| 2004/0256351 A1* | 12/2004 | Chung et al. | 216/13 |
| 2005/0020093 A1* | 1/2005 | Ahn et al. | 438/782 |
| 2005/0221612 A1* | 10/2005 | Brown et al. | 438/643 |

* cited by examiner

*Primary Examiner*—Alexander G Ghyka
*Assistant Examiner*—Seahvosh J Nikmanesh
(74) *Attorney, Agent, or Firm*—Bacon & Thomas, PLLC

(57) ABSTRACT

An interconnection process is provided. The process includes the following steps. Firstly, a semiconductor base having at least a electrical conductive region is provided. Next, a dielectric layer with a contact hole is formed to cover the semiconductor base, wherein the contact hole exposes part of the electrical conductive region. Then, a thermal process is performed on the semiconductor base covered with the dielectric layer. Lastly, a conductive layer is formed on the dielectric layer, wherein the conductive layer is electrically connected to the electrical conductive region through the contact hole.

10 Claims, 2 Drawing Sheets

INTERCONNECTION PROCESS

BACKGROUND OF THE INVENTION

1. Field of the Invention

The invention relates in general to a semiconductor technology, and more particularly to an interconnection process.

2. Description of the Related Art

As the dimension of the integrated circuit (IC) element is getting smaller, the aspect ratio of the contact hole in the dielectric layer during the interconnection process increases accordingly, making it more difficult to maintain the quality of local interconnection.

Let the interconnection process using tungsten for local interconnection and having a contact hole whose aperture is larger than 0.2 micrometer (μm) be taken for example. Normally, a stacking layer containing titanium/titanium nitride (Ti/TiN) is formed via physical vapor deposition (PVD) technology to be used as the barrier layer and the adhesion layer for the conductive layer (tungsten) subsequently formed. As the aperture of the contact hole reduces, the aspect ratio increases, and the open problem occurring to PVD technology is even worse. The ionized metal plasma (IMP) technology using metallic organic chemical deposition (MOCVD) technology has the advantage of increasing the coverage rate at the bottom of the contact hole, but still has over-hang phenomenon and the problems that the MOCVD titanium nitride film contains too many impurities like carbon, hydrogen and oxygen.

Currently, the interconnection process using chemical vapor deposition (CVD) with $TiCl_4$ can achieve better quality in the overall manufacturing process. For example, better coverage conformality is achieved, and the filming resistance of the stacking layer is within an acceptable range and the cost is cheaper. However, the titanium-silicon compound formed from the reaction between the stacking layer and the silicon base is still lack of uniformity.

SUMMARY OF THE INVENTION

The invention is directed to an interconnection process which performs a thermal process on a semiconductor base before a conductive layer is deposited so as to obtain better conditions for the contact hole.

According to a first aspect of the present invention, an interconnection process is provided. The process includes the following steps. Firstly, an electrical conductive region situating at a semiconductor base is provided. Next, a dielectric layer with a contact hole is formed to cover the semiconductor base, wherein the contact hole exposes part of the electrical conductive region. Then, a thermal process is performed on the semiconductor base covered with the dielectric layer. Lastly, a conductive layer is formed on the dielectric layer, wherein the conductive layer is electrically connected to the electrical conductive region through the contact hole.

The invention will become apparent from the following detailed description of the preferred but non-limiting embodiments. The following description is made with reference to the accompanying drawings.

DETAILED DESCRIPTION OF THE INVENTION

Figure 1:
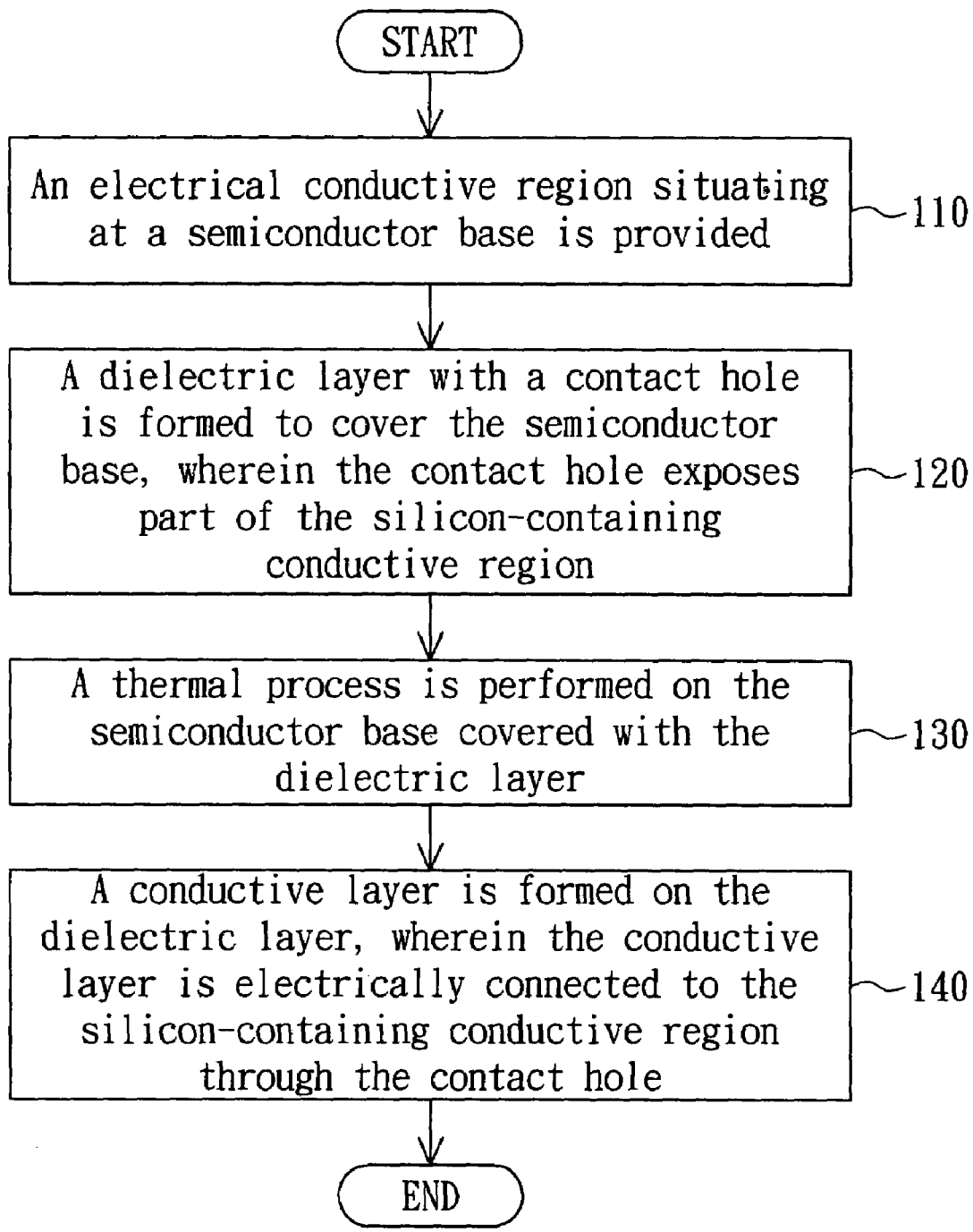
FIG. 1 is a flowchart of an interconnection process according to the invention.

Referring to FIG. 1, a flowchart of an interconnection process according to the invention is shown. Firstly, the process begins at step 110, an electrical conductive region situating at a semiconductor base is provided. Next, the process proceeds to step 120, a dielectric layer with a contact hole is formed to cover the semiconductor base, wherein the contact hole exposes part of the electrical conductive region. Then, the process proceeds to step 130, a thermal process is performed on the semiconductor base covered with the dielectric layer. Lastly, the process proceeds to step 140, a conductive layer is formed on the dielectric layer, wherein the conductive layer is electrically connected to the electrical conductive region through the contact hole.

The interconnection process of the invention is further exemplified by the tungsten local interconnection process using titanium tetrachloride ($TiCl_4$). However, any one who is skilled in the technology of the invention will understand that the invention can be used in any integrated circuit to improve the conditions for the contact hole, such that the overall efficiency of the integrated circuit is improved and the design of the IC manufacturing process is more flexible.

Figure 2A:
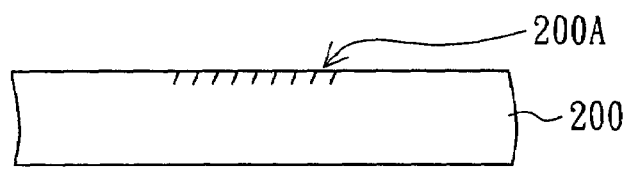
FIGS. 2A~2D respectively are cross-sectional views of a tungsten local interconnection process according to a preferred embodiment of the invention.

Referring to FIGS. 2A~2D, respective cross-sectional views of a tungsten local interconnection process according to a preferred embodiment of the invention are shown. FIG. 2A illustrates the step 110 of providing the electrical conductive region 200A situating at the semiconductor base 200. Examples of the electrical conductive region 200A (marked by oblique lines) include doped areas such as the drain or the source of a certain transistor element. The semiconductor base 200 includes a number of transistor elements (not illustrated) for example.

Figure 2B:
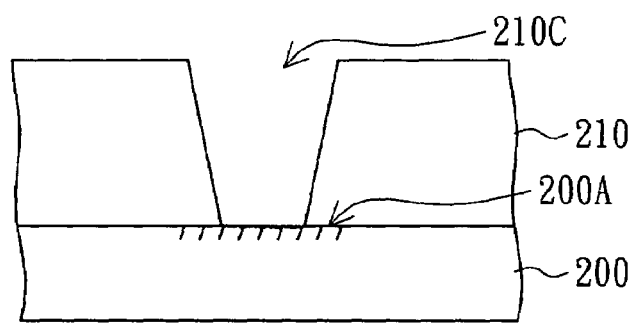

FIG. 2B illustrates the step 120 of forming a dielectric layer 210 with a contact hole 210c to cover the semiconductor base 200, wherein the contact hole 210c exposes part of the electrical conductive region 200A. However, there are probably some inorganic or organic pollutants left in the contact hole 210c, such as impurity particles in the manufacturing environment or residuals and by-products (polymers) generated during the photo-resist, etching or patterning process, and even the native oxides of the semiconductor base 200. Moreover, the surface structure of the exposed electrical conductive region 200A might be uneven due to the etching process for the formation of the contact hole 210c. The quality of forming the film of the titanium-silicon compound in the subsequent step depends substantially on whether the surface of the electrical conductive region 200A is clean and smooth enough.

Figure 2C:
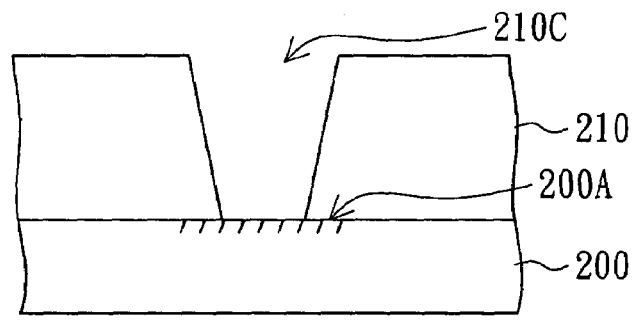

FIG. 2C illustrates the step 130 of performing a thermal process on the semiconductor base 200 covered with the dielectric layer 210. In the present embodiment of the invention, the thermal process is exemplified by the annealing process using high-temperature furnace and pipe, such that the semiconductor base 200 covered with the dielectric layer 210 is annealed within the nitrogen environment of 450 to 700° C. for 20 to 180 minutes (the flow rate is approximately 1 to 10 slm, and the pressure is approximately 1 atm). In other embodiments, the thermal process can also be a rapid thermal processing (RTP) with higher temperature setting. By the thermal process performed in step 130, the remnants in the contact hole 210c that are harmful to the subsequent interconnection process are removed effectively and the surface structure of the semiconductor base 200 is repaired, such that the electrical conductive region 200A is more clean and smooth.

Before the stacking layer is deposited, the conventional metallization process pre-cleans the surface of the semiconductor base by hydrogen fluoride or relative mixed solution to avoid the oxygen contamination, such that the contact hole 210c achieves suitable conditions for deposition. However, the pre-cleaning step has limited removing effect on the above harmful remnants and has no contribution to the improvement of the surface structure of the electrical conductive region 200A. Therefore, the invention achieves better deposition conditions by a thermal process as described above. The pre-cleaning step can be performed before the step 140.

Figure 2D:
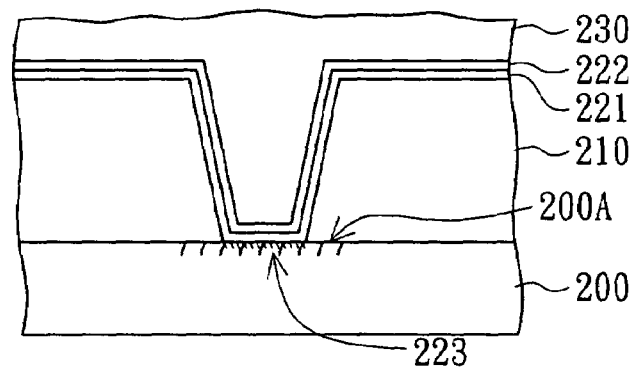

FIG. 2D illustrates the step 140 of forming a conductive layer 230 by sputtering deposition after achieving suitable conditions for the contact hole 210c in step 130. In the present embodiment of the invention, the conductive layer 230 contains tungsten (W). Normally, an adhesion layer 221 containing titanium and a barrier layer 222 containing titanium nitride are formed among the conductive layer 230, the contact hole 210c, and the electrical conductive region 200A as indicated in FIG. 2D. The adhesion layer 221 can be formed by using the plasma enhanced chemical vapor deposition (PECVD) technology with the reaction gas such as $TiCl_4$ and $H_2$. During the formation of the adhesion layer 221, the reaction temperature can range between 450 and 650° C., such that the deposited Ti can react with the electrical conductive region 200A to form a titanium-silicon compound layer 223 ($TiSi_x$) such that the contact resistance is further reduced. In addition to preventing the conductive layer 230 containing tungsten from peeling off, the barrier layer 222 also protects the structure of the adhesion layer 221 and titanium-silicon compound, lest titanium might react with the conductive layer 230 and become poisoning and form volcano protrusions. An ordinary planarization by polishing step can be performed after the conductive layer 230 is formed. The polishing step is known to any one who is skilled in the technology of the invention, hence is not repeated here.

As the formation of the titanium-silicon compound is very fast, the smaller the aperture of the contact hole 210c, the film quality of titanium-silicon compound will be more heavily affected by the harmful remnants inside the contact hole 210c as well as the surface factors of the electrical conductive region 200A, and the uniformity of the titanium-silicon compounds formed on other electrical conductive regions of the semiconductor base 200 will be more diversified. Consequently, the characteristics such as the contact resistance of the elements of the semiconductor base are unstable, and the yield rate of the wafer is largely decreased. The thermal process performed in step 130 results in better conditions for all the contact holes on the semiconductor base 200 and thereby better uniformity for the titanium-silicon compound is achieved, hence largely enhancing the performance of the transistor elements and increasing product yield rate. Thus, the contact hole can be reduced to be as small as 0.1 um to maintain the quality of the interconnection process.

According to the interconnection process disclosed in the above embodiments of the invention, a thermal process is performed on the semiconductor base before the conductive layer is deposited such that better conditions for the contact hole are achieved. The interconnection process of the invention can be applied to any integrated circuit to improve the conditions for the contact hole, such that the overall efficiency of integrated circuit is improved and the IC process window is more flexible.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An interconnection process, comprising:
   (a) providing an electrical conductive region situating at a semiconductor base;
   (b) forming a dielectric layer with a contact hole to cover the semiconductor base, wherein the contact hole exposes part of the electrical conductive region;
   (c) performing a thermal process on the semiconductor base covered with the dielectric layer, wherein the thermal process is performed at a temperature 450° C. to 700° C.; and
   (d) forming a conductive layer on the dielectric layer after the step (c) of performing the thermal process, wherein the conductive layer is electrically connected to the electrical conductive region through the contact hole.

2. The interconnection process according to claim 1, wherein between the step (b) and the step (d), the process further comprises:
   pre-cleaning the semiconductor base.

3. The interconnection process according to claim 1, wherein in the step (c), the thermal process is an annealing process or a rapid thermal processing (RTP).

4. The interconnection process according to claim 1, wherein in the step (d), the conductive layer contains tungsten (W).

5. The interconnection process according to claim 1, wherein between the step (c) and the step (d), the process further comprises:
   (c1) forming a stacking layer to cover the surface of the contact hole and the electrical conductive region.

6. The interconnection process according to claim 5, wherein in the step (d), the conductive layer contains tungsten (W), the stacking layer comprises a first layer containing titanium and a second layer containing titanium nitride, and the first layer is positioned between the electrical conductive region and the second layer.

7. The interconnection process according to claim 6, further comprises:
   forming a titanium-silicon compound layer between the first layer and the electrical conductive region.

8. The interconnection process according to claim 6, wherein in the step (c1), a gas containing titanium tetrachloride is used to form the first layer and the second layer.

9. The interconnection process according to claim 8, wherein the reaction temperature for forming the first layer ranges between 450° C. and 650° C.

10. The interconnection process according to claim 1, wherein after the step (d), the process further comprises:
    performing a polishing step.

* * * * *